NEGATIVE RESISTANCE SEMICONDUCTOR DEVICES

Filed Dec. 12, 1966

Takahiko Kasugai
Susumu Nojima
INVENTORS
by George B. Oujevolk
Attorney

United States Patent Office 3,419,764

Patented Dec. 31, 1968

3,419,764

NEGATIVE RESISTANCE SEMICONDUCTOR DEVICES

Takahiko Kasugai, No. 518 Futako, Kawasaki-shi, Japan, and Susumu Nojima, No. 211, 5-chome, Saginomiya, Nakano-ku, Tokyo, Japan Continuation-in-part of application Ser. No. 266,858, Mar. 21, 1963. This application Dec. 12, 1966, Ser. No. 601,203

7 Claims. (Cl. 317—234)

The present invention relates to negative resistance devices and particularly concerns junction type semiconductor diodes having negative resistance characteristics. This is a continuation-in-part of applicants' application Ser. No. 266,858 filed Mar. 21, 1963, now Patent No. 3,335,337.

Well known semiconductor devices which exhibit negative resistance characteristics are four-layered diodes, avalanche diodes, Ezaki or tunnel diodes and the like. These prior semiconductor devices are usually doped with what is called "shallow-level impurities," i.e., metals of either Group III or V in the Periodic Table.

It is an object of this invention to provide improved negative resistance junction type diodes which exhibit the negative resistance characteristic at the room temperature without using any particular devices such as a cooling device.

Another object of this invention is to provide negative resistance junction type diodes which require only a short switching period of time.

Still another object of this invention is to provide negative resistance junction type diodes wherein the point of transition from positive to negative or from negative to positive dynamic resistance can be easily controlled or determined.

In general, a negative resistance junction type diode embodying this invention is obtained by impregnation of certain impurity metals, which do not belong to Groups III and V of the Periodic Table, from the sides towards the central portion of a conventional semiconductor of a predetermined conductive type in such a manner that predetermined gradients of concentration of additional impurity metals other than the conventional Group III and Group V elements are established so as to produce high doped $N^+$ type and high doped $P^+$ type end regions separated by an intermediate region, where said additional impurity metals exist and the original conductive type due to the conventional Group III or Group V impurities persists. The additional impurities impregnated into the semiconductor according to the invention develop either deep-lying donor energy level or deep-lying acceptor energy level in the forbidden band depending upon their valence, which level is usually distant of the order of several tenths of $KTe^V$ unit below the conduction band in the former case and above the valence band in the latter case. Where K is Boltzmann's constant and T is the absolute temperature. The distribution of such additional impurities in the afore-mentioned manner makes it possible to obtain negative resistance junction type diodes having a negative resistance characteristic at the room temperature without using any particular device similar to that of prior negative resistance semiconductor devices such as four-layer diodes and avalanche diodes. Hereafter in this specification, a deep-lying energy level is defined as an energy level with said distance of the order of several tenths of $KTe^V$ unit, and a shallow-lying energy level is defined as an energy level in the forbidden band produced by impregnation of the impurity metals which belong to the Groups III and V of the Periodic Table.

The foregoing and other objects and features of the invention will be understood from the following description with reference to the accompanying drawing, in which.

Figure 1:
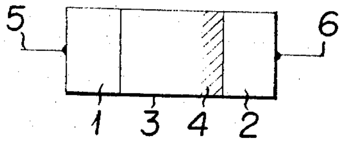
FIG. 1 is a schematic representation, greatly exaggerated, of one embodiment of the junction type semiconductor diode according to the invention.

Referring now to the accompanying drawing, FIG. 1 illustrates one embodiment of negative resistance semiconductor diode constructed to be of $P^+NN^+$ type in accordance with the principle of this invention. It comprises a parent silicon body of N type which is doped such that it has a resistivity of over 10 ohm-cm., and whose each side is formed to $P^+$ region 1 and $N^+$ region respectively by alloyed and diffused aluminum on one side and gold-antimony alloy (with antimony content of 0.5%) on another side by means of heating in vacuum keeping an intermediate region 3 having a thickness of about 10 to 300$\mu$. The heating temperature at the time of diffusion is selected to be between 800° C. and 1,000° C., and the diffusing time is controlled in a range running from 10 to 200 minutes, depending upon the diffusing temperature.

It has been well known that impurity elements which set up the deep-lying energy level usually have a diffusion constant very great as compared to that of conventional impurities which set up the ordinal shallow-lying energy level. Accordingly, it is possible to selectively diffuse only the impurities that will establish the deep-lying energy level by carrying out the diffusion at temperatures somewhat higher than the alloying temperature but lower than the temperature at which shallow-lying energy level impurities are diffused. In this manner, one side of N type parent silicon body may be impregnated with antimony from gold-antimony alloy to produce $N^+$ type semiconductor region 2, while concurrently doping gold which develops the deep-lying energy level from the same side in such a manner that a gradient of concentration of gold decreases from the interjunction between the $N^+$ type region and the intermediate region towards the center of the intermediate region.

In accordance with this invention it is necessary that the concentration of the deep-lying energy level impurities is greater than the concentration of the shallow-lying energy level impurities at a portion of the intermediate region adjacent the above-mentioned interjunction between the $N^+$ type and the intermediate region. In case the shallow-lying energy level impurities include both donor and acceptor impurities the concentration is considered to be the net density between them.

Thus, according to this invention a junction type semiconductor diode having a voltage-current characteristic containing a negative negative resistance characteristic portion may be obtained by appropriately controlling the degree of diffusion of deep-level impurities into the intermediate region, that is, by suitably selecting the time interval of diffusion within a temperature range between 800° C. and 1,000° C. However, when the silicon body heated to a temperature above 1,000° C. is maintained at that temperature beyond the selected interval of time, the diffusion will proceed beyond a predetermined degree and in the extreme case gold will be diffused in the entire intermediate region, so that the electrical characteristic, that is, the negative resistance characteristic of the diode which it is the object of the invention to provide will be hampered or cannot be obtained.

As shown in FIG. 1, the diode according to the invention has its end regions 1 and 2 provided with terminal leads 5 and 6 respectively. By forwardly biasing the diode across leads 5 and 6 the desired negative resistance characteristic will be obtained.

When the above described diode is forwardly biased, free carriers are injected and a quasi-Fermi level which has been previously set up due to the aggregate doping of the above described impurities undergoes fluctuation, whereby the resistivity of the intermediate region containing deep-lying energy level impurities decreases. When the free carries injected reach a threshold value, dissociated deep-lying energy level impurities almost disappear, and thereafter the diode behaves substantially in the same way as the forwardly biased conventional semiconductor diode containing only shallow-lying energy level impurities.

Figure 2:
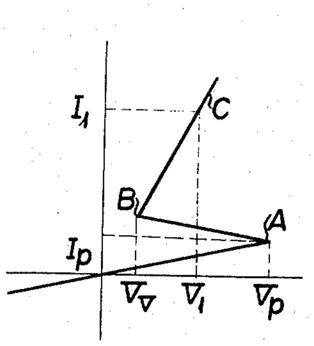
FIG. 2 is a plot of the voltage-current characteristic of the diode shown in FIG. 1.

The above-described semiconductor diode in accordance with this invention can provide a voltage-current characteristic as shown in FIG. 2. As will be clear from the figure this diode exhibits a negative resistance characteristic between points A and B. In FIG. 2, $V_p$ and $I_p$ represent the voltage and the current, respectively, at point A, while $V_v$ represents the voltage at point B. It is possible to manufacture semiconductor diodes having a voltage $V_p$ on this characteristic with a value in a very wide range of from 0.5 volt to several hundred volts, and the value of the voltage $V_v$ may be made to be relatively small of the order of about 0.4 to 1.5 volts. Moreover, it is possible to pass current $I_1$ of about 300 milliamperes when voltage $V_1$ is about 1.5 volts which lie on the portion of the characteristic that is similar to the conventional diode characteristic; that is, the portion of the characteristic between points B and C. It is to be understood that the above mentioned numerical values are shown only for the purpose of illustration. From FIG. 2 it will be easily seen that the reverse bias characteristic of the semiconductor diode according to the invention is substantially equal to that of the conventional PN junction type diode.

The inventors conducted experiments by making an N type silicon body having a resistivity of 20 ohm-cm. and etched to have a thickness of 200$\mu$, and by alloying and diffusing aluminum to have a thickness of 40$\mu$ and gold-antimony alloy (with antimony content of 0.5%) to have a diameter of 100$\mu$ from both sides of the body in vacuum for less than 10 minutees at 900° C. and with a total heating time at above 800° C. of not exceeding 30 minutes to obtain, as result, negative resistance semiconductor diodes which have a voltage-current characteristic at the room temperature as shown in FIG. 2 with a value of $V_p$ ranging from 10 to 30 volts, $I_p$ ranging from 60 to 120 microamperes and a voltage at $I_1=100$ milliamperes ranging between 0.95 and 1.1 volts. Thus, by appropriately selecting the extrinsic semiconductor material and the additional impurities to be doped the diffusion constant and the concentration are determined as function of the temperature. Hence, the desired characteristic of the diode to be manufactured dictates the resistivity of the parent semiconductor body, and the diffusion temperature and the diffusion time are determined depending upon the kinds of the impurities which set up deep-lying energy levels.

Figure 3:
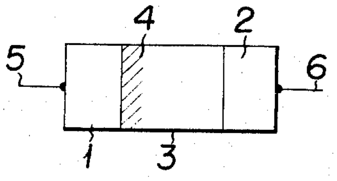
FIGS. 3 to 7 inclusive illustrate various other modifications of the diode according to the invention.
Figure 4:
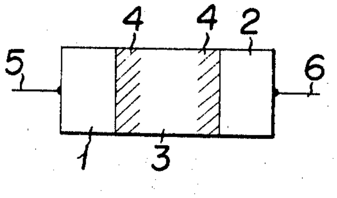

FIG. 3 illustrates a modification of the diode according to this invention comprising a $P^+$ type semiconducting region 1, an $N^+$ type semiconductor region 2 and an N type intermediate region 3, where the gradient of concentration of the impuriteis which develop a deep-lying energy level in the region adjacent to the $P^+$ type semiconductor region 1 is made such that it will increase toward the $P^+$ type semiconductor region 1. FIG. 4 illustrates still another modification of this invention where the concentration of the impurities indicated at 4 which set up the deep-lying energy level in the N-type intermediate region 3 interposed between the $P^+$ type semiconductor region 1 and the $N^+$ type semiconductor region 2 is made greater towards the $P^+$ type and $N^+$ type semiconductor regions 1 and 2 respectively.

With the semiconductor diodes shown in FIGS. 3 and 4, it is also possible to obtain characteristics similar to those of the embodiment shown in FIG. 1.

Figure 5:
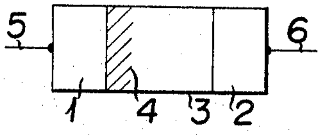
Figure 6:
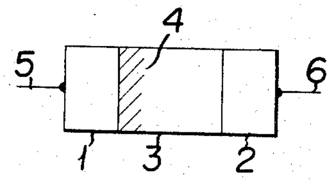
Figure 7:
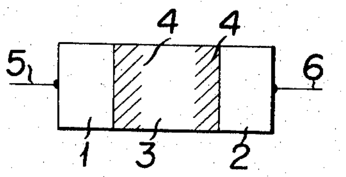

In still further embodiments illustrated in FIGS. 5 to 7 inclusive, the semiconductor diodes are of the $P^+PN^+$ junction type having an intermediate region 3 of the P type, the gradient of the concentration of the impurities 4 setting up the deep-lying energy level being similar to that in the embodiments of FIGS. 1, 3 and 4. The characteristics of the embodiments shown in FIGS. 5 to 7 inclusive also have negative resistance portions at certain values of the voltages and current as in the previous embodiments. In these figures like reference numerals indicate the same or similar parts as in FIG. 1. As the impurities 4 setting up deep-lying energy level may be used gold, copper, iron, zink, nickel, when silicon is used as the semiconductor, whereas gold, iron, copper, nickel, cobalt, are effective when germanium is utilized as the semiconductor. Semiconductor regions 1 and 2 are provided with terminal leads 5 and 6, respectively.

In comparison of these seminconductor diodes having the structure as above described with prior semiconductor diodes having negative resistance characteristics, the present invention enables not only to control the magnitude of the voltage $V_p$ on the characteristic curve shown in FIG. 2, or the point of transition from positive to negative resistance characteristics or vice versa, by controlling the width or length of the regions which are included in the intermediate region of the PN junction and containing impurities of deep-lying energy level but also can decrease the life time of minority carriers by doping impurities of deep-lying energy level, thus enabling the decrease of switching time when the semiconductor devices are utilized as the switching elements. The semiconductor diodes according to this invention, accordingly, have a wide field of applications as the circuit elements. It is very easy to distribute the impurities so as to provide the required concentration gradient by conventional techniques, such as solid diffusion.

If it is intended to produce the diode according to the invention by having resort to conventional diffusion or epitaxial-growth methods, after the formation of the junction the deep-lying energy level impurities may be diffused from one or both sides of the semiconductor in the manner as hereinbefore described to accomplish the required doping.

While the invention has been described in conjunction with exemplary embodiments thereof, it will be apparent that changes and modifications may be made in the details of the construction without departing from the scope and spirit of the invention as defined in the appended claims.

What is claimed is:

1. A negative resistance semiconductor diode comprising a high doped $P^+$ type semiconductor region, a high doped $N^+$ type semiconductor region, and an intermediate region interposed between said $P^+$ type and $N^+$ type regions and doped with predetermined metal impurities of Groups III and V in the Periodic Table to have a predetermined conductive type, said intermediate region being further doped with deep level impurities other than the Groups III and V doping elements in such a manner that the gradient of concentration of said deep level impurities decreases from the selected interjunction between said intermediate region and said selected high doped type semiconductor region toward the central portion of said intermediate region, and the concentration of said deep level impurities being greater than the concentration of said metal impurities of Groups III and V at a portion of said intermediate region adjacent said selected interjunction.

2. The semiconductor diode according to claim 1 wherein said intermediate region is of the N type, a portion of said intermediate region adjacent to said $N^+$ type semiconductor region is doped with said additional impurities, and the concentration of said deep level impurities is gradually decreased toward the center of said intermediate region.

3. The semiconductor diode according to claim 2 wherein a portion of said intermediate region adjacent to said P+ type semiconductor region is doped with said deep level impurities and the concentration of said deep level impurities is gradually decreased toward the central portion of said intermediate region.

4. The semiconductor diode according to claim 2 wherein opposite portions of said intermediate region adjacent to said P+ type and N+ type semiconductor regions, respectively, are doped with said deep level impurities and the concentration of said deep level impurities in both of said portions is gradually decreased toward the central portion of said intermediate region.

5. The semiconductor diode according to claim 1 wherein said intermediate region is of the P type, the portion of said intermediate region adjacent to said P+ type semiconductor region is doped with said deep level impurities and the concentration of said impurities is gradually decreased toward the central portion of said intermediate region.

6. The semiconductor diode according to claim 5 wherein the portion of said intermediate region adjacent to said N+ type semiconductor region is doped with said deep level impurities and the concentration of said deep level impurities is gradually decreased toward the central portion of said intermediate region.

7. The semiconductor diode according to claim 5 wherein opposite portions of said intermediate region adjacent to said P+ type and N+ type semiconductor regions, respectively, are doped with said deep level impurities and the concentration of said deep level impurities in both of said portions is gradually decreased toward the central portion of said intermediate region.

References Cited

UNITED STATES PATENTS 3,244,566 4/1966 Mann et al. ---------- 317—235
3,337,779 8/1967 Bowman et al. ------ 317—234

JOHN W. HUCKERT, *Primary Examiner.*

J. D. CRAIG, *Assistant Examiner.*

U.S. Cl. X.R.

148—190